US012563839B2

(12) United States Patent
Bouvier et al.

(10) Patent No.: US 12,563,839 B2
(45) Date of Patent: Feb. 24, 2026

(54) INTEGRATED RC ARCHITECTURE, AND METHODS OF FABRICATION THEREOF

(71) Applicant: Murata Manufacturing Co., Ltd., Nagaokakyo (JP)

(72) Inventors: Stéphane Bouvier, Cairon (FR); Larry Buffle, Caen (FR); Sophie Gaborieau, Sainte Honorine du Fay (FR)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 330 days.

(21) Appl. No.: 17/363,479

(22) Filed: Jun. 30, 2021

(65) Prior Publication Data

US 2021/0327867 A1     Oct. 21, 2021

Related U.S. Application Data

(63) Continuation of application No. PCT/IB2020/050081, filed on Jan. 7, 2020.

(30) Foreign Application Priority Data

Jan. 8, 2019     (EP) ..................................... 19305026

(51) Int. Cl.
   *H01L 27/01*          (2006.01)
   *H01L 21/70*          (2006.01)
   (Continued)

(52) U.S. Cl.
   CPC ........... *H10D 86/85* (2025.01); *H01L 21/707* (2013.01); *H03H 1/02* (2013.01); *H03H 3/00* (2013.01);
   (Continued)

(58) Field of Classification Search
   CPC ............... H01L 27/0682; H01L 29/945; H01L 28/20–26; H01L 21/707; H01L 23/5223;
   (Continued)

(56) References Cited

U.S. PATENT DOCUMENTS 7,738,226 B2 *   6/2010   Berberich ............. H01L 29/945
                                                   257/533
8,643,071 B2 *   2/2014   Pan ..................... H01L 29/7813
                                                   257/302
(Continued)

OTHER PUBLICATIONS

International Search Report issued for PCT/IB2020/050081, date of mailing Mar. 26, 2020.

(Continued)

*Primary Examiner* — Jarrett J Stark
(74) *Attorney, Agent, or Firm* — ArentFox Schiff LLP

(57)     ABSTRACT

RC architectures are provided that include a substrate provided with a capacitor having a thin-film top electrode portion at a surface of the substrate on one side thereof. The resistance provided in series with the capacitor is controlled by providing a contact plate, spaced from the thin-film top electrode portion, and a set of plural bridging contacts extending between, and electrically interconnecting, the thin-film top electrode portion and the contact plate. Different resistance values can be set by appropriate selection of the number of bridging contacts. The capacitor can be a three-dimensional capacitor and contacts are then provided on respective first and second sides of the substrate, which face each other in the thickness direction of the substrate.

14 Claims, 7 Drawing Sheets

(51) Int. Cl.
H03H 1/02 (2006.01)
H03H 3/00 (2006.01)
H10D 1/00 (2025.01)
H10D 1/47 (2025.01)
H10D 1/68 (2025.01)
H10D 86/85 (2025.01)

(52) U.S. Cl.
CPC .............. H10D 1/042 (2025.01); H10D 1/47 (2025.01); H10D 1/716 (2025.01)

(58) Field of Classification Search
CPC .... H01L 23/5228; H10D 86/85; H10D 1/042; H10D 1/47; H10D 1/716; H10D 84/206; H10D 1/665; H03H 1/02; H03H 3/00
See application file for complete search history.

(56) References Cited

U.S. PATENT DOCUMENTS

| | | | | |
|---|---|---|---|---|
| 9,178,080 | B2 * | 11/2015 | Kalnitsky | H01L 29/945 |
| 9,947,709 | B2 * | 4/2018 | Huang | H01L 27/0688 |
| 9,960,285 | B2 * | 5/2018 | Chou | H01L 29/945 |
| 10,388,781 | B2 * | 8/2019 | Bobde | H01L 29/7811 |
| 10,586,844 | B2 * | 3/2020 | Lin | H01L 23/49524 |
| 2003/0224571 | A1 * | 12/2003 | Iijima | H01L 28/75 |
| | | | | 257/E21.018 |
| 2005/0013090 | A1 * | 1/2005 | Ahrens | H01L 29/66181 |
| | | | | 257/E21.396 |
| 2005/0266652 | A1 * | 12/2005 | Chudzik | H01L 28/87 |
| | | | | 438/387 |
| 2007/0018748 | A1 * | 1/2007 | Smolders | H03H 7/06 |
| | | | | 333/1 |
| 2007/0274014 | A1 * | 11/2007 | Berberich | H03K 17/0814 |
| | | | | 257/E27.024 |
| 2010/0032801 | A1 * | 2/2010 | Jacobs | H01L 23/5223 |
| | | | | 257/532 |
| 2010/0219502 | A1 * | 9/2010 | Shieh | H01L 28/40 |
| | | | | 257/532 |
| 2011/0066418 | A1 * | 3/2011 | Yamada | G06F 30/367 |
| | | | | 703/14 |

| | | | | |
|---|---|---|---|---|
| 2012/0012982 | A1 * | 1/2012 | Korec | H01L 28/20 |
| | | | | 257/E21.598 |
| 2012/0061798 | A1 * | 3/2012 | Wong | H01L 29/945 |
| | | | | 257/532 |
| 2012/0175700 | A1 * | 7/2012 | Hsieh | H01L 29/417 |
| | | | | 257/334 |
| 2012/0211865 | A1 * | 8/2012 | Tian | H01L 28/90 |
| | | | | 257/532 |
| 2013/0161792 | A1 * | 6/2013 | Tran | H01L 29/66083 |
| | | | | 438/386 |
| 2013/0175666 | A1 * | 7/2013 | Tran | H01L 28/40 |
| | | | | 257/532 |
| 2015/0264813 | A1 * | 9/2015 | Zhou | H05K 1/162 |
| | | | | 29/25.03 |
| 2016/0020267 | A1 * | 1/2016 | Lin | H01L 29/945 |
| | | | | 257/532 |
| 2016/0087030 | A1 * | 3/2016 | Robutel | H01L 29/66181 |
| | | | | 438/387 |
| 2016/0268144 | A1 | 9/2016 | Voiron et al. | |
| 2019/0229180 | A1 * | 7/2019 | Lin | H01L 23/49589 |
| 2019/0229181 | A1 * | 7/2019 | Jia | H01L 23/49575 |
| 2020/0066922 | A1 * | 2/2020 | Cheng | H01L 27/016 |
| 2021/0005381 | A1 * | 1/2021 | Lu | H01L 28/60 |
| 2021/0005393 | A1 * | 1/2021 | Lu | H01L 29/66181 |
| 2021/0005707 | A1 * | 1/2021 | Lu | H01L 27/0805 |
| 2021/0005708 | A1 * | 1/2021 | Lu | H01L 28/75 |
| 2021/0118618 | A1 * | 4/2021 | Shin | H01L 23/642 |
| 2021/0327867 | A1 * | 10/2021 | Bouvier | H01L 28/20 |
| 2022/0028827 | A1 * | 1/2022 | Ding | H01L 23/5383 |
| 2022/0406885 | A1 * | 12/2022 | Hu | H01L 29/945 |
| 2023/0017133 | A1 * | 1/2023 | Yamaguchi | H01L 28/20 |

OTHER PUBLICATIONS

Written Opinion of the International Searching Authority issued for PCT/IB2020/050081, date of mailing Mar. 26, 2020.

European Search Report issued for corresponding EP Application No. 19 30 5026, dated Jul. 3, 2019.

J. vom Dorp et al.; "Monolithic RC-Snubber for Power Electronic Applications"; 2011 IEEE Ninth International Conference on Power Electronics and Drive Systems (PEDS), Dec. 5, 2011, pp. 11-14.

* cited by examiner

FIG.1A
PRIOR ART
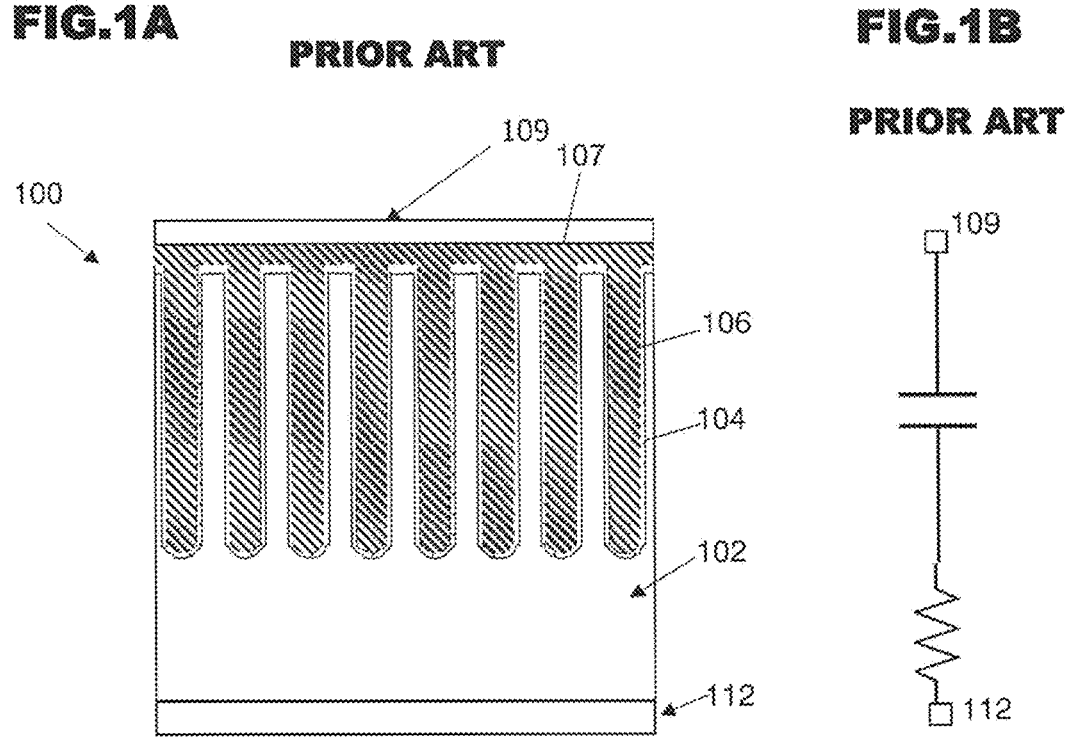
FIG.1B
PRIOR ART
FIG.1C
PRIOR ART
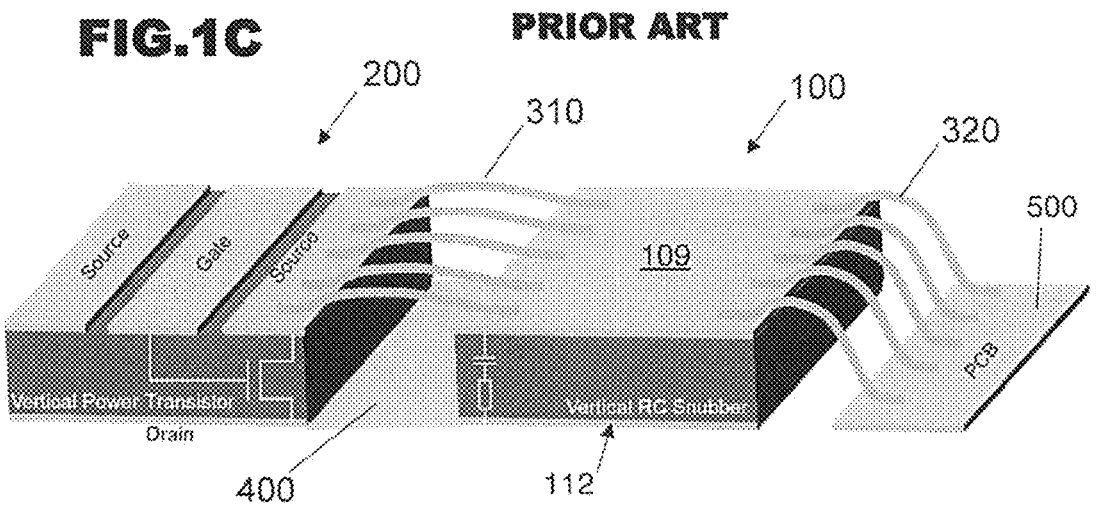

FIG.3A
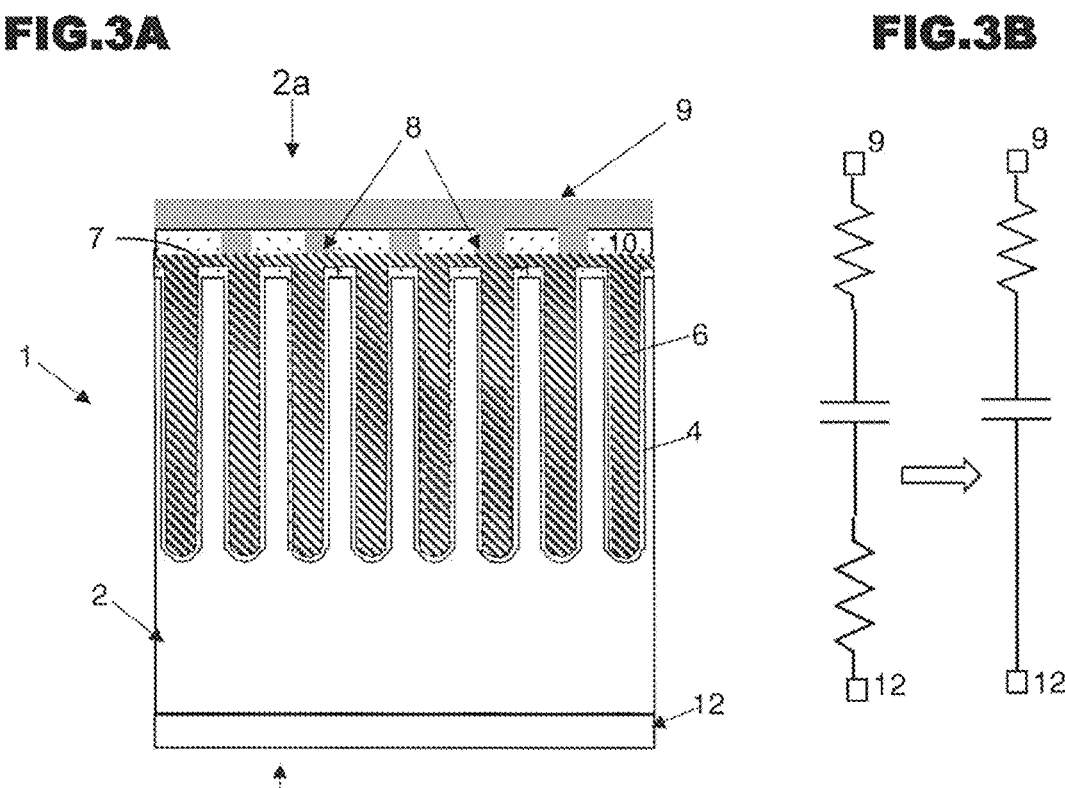
FIG.3B
FIG.3C
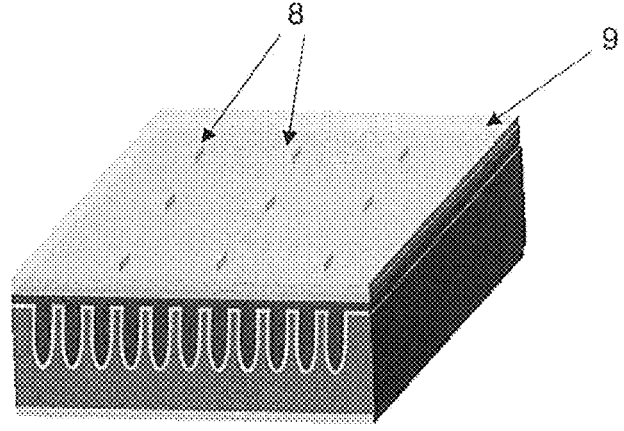

Form texture in
substrate surface — S501

Deposit dielectric
layer  conformally
over texture — S502

Deposit conductive
material
on dielectric layer — S503

Deposit insulator
over capacitor-
electrode portion 7 — S504

Form set of N via holes
(N depends on target
resistance value) — S505

Form bridging contacts
in via holes — S506

Form top contact
plate — S507

Form backside
metallization — S508

INTEGRATED RC ARCHITECTURE, AND METHODS OF FABRICATION THEREOF

CROSS REFERENCE TO RELATED APPLICATIONS

The present application is a continuation of PCT/IB2020/050081 filed Jan. 7, 2020, which claims priority to European Patent Application No. 19305026.7, filed Jan. 8, 2019, the entire contents of each of which are incorporated herein by reference.

FIELD OF THE INVENTION

The present invention relates to a new architecture for an integrated RC network, and to methods of fabrication of such RC architectures.

BACKGROUND

Many electrical circuits require connection to an RC network. For example, RC networks are often connected to power electronics devices and used as "snubbers" to prevent or attenuate voltage transients (spikes) caused by rapid changes in current, to damp oscillations or overshoot due to inductive load switching, and so on. Typically, the voltage transients are generated by reactances in a power circuit. The reactances may be parasitic.

A widely-used damping snubber network architecture consists of a resistor and a capacitor connected in series with one another. Typically, the damping RC snubber network is connected in parallel with a switch or reactance in a power electronics device.

RC networks can also be found within RF power amplifiers and other devices.

RC networks can be implemented in various ways. One conventional approach for implementing an RC network consists in soldering a discrete resistor and a discrete capacitor onto a printed circuit board. A disadvantage of this first approach is that the discrete components occupy a large surface area on the mounting board. Another disadvantage is the high inductive parasitics that arise with such an arrangement.

A second approach consists in integrating an RC network with an active circuit (e.g. a power transistor) to be snubbed. In the context of automotive applications, such as fully electrical and hybrid cars, integrated RC snubbers are used to suppress electrical oscillations induced by inductive load switching (e.g. electrical motor control). These applications generate high combined constraints on this kind of component, notably: ability to withstand high temperature, ability to withstand high voltage, ability to withstand high currents, high reliability, low thickness, good thermal conductivity, and low inductive parasitic (ESL), . . . ). However, implementing integrated capacitors and resistors using regular 2D (planar) semiconductor technology has not been able to satisfy all the combined constraints discussed above, mainly because of the inability of this technology to provide the necessary high capacitance density (F/mm²) in combination with the ability to withstand the necessary high operating voltage. Recently this limitation has been mitigated by the development of 3D capacitors (e.g. trench capacitors) which enable the merit factor Capacitance Density*Breakdown Voltage to be improved by a ratio of more than fifty.

The paper "Monolithic RC-Snubber for Power Electronic Applications" by vom Dorp, et al (IEEE PEDS 2011, Singapore 5-8 Dec. 2011) proposes a monolithic RC snubber component, that is, a single integrated passive device incorporating an interconnected resistance and capacitance. Appended FIG. 1A is a diagram representing a cross-sectional view through this RC component 100, FIG. 1B shows the equivalent circuit, and FIG. 1C illustrates how the RC component 100 may be connected in parallel to a device 200 that requires snubbing.

As can be seen from FIG. 1A, the RC component 100 comprises a semiconductor substrate 102 (in this case a silicon substrate) and this substrate 102 defines the bottom electrode of a three-dimensional (3D) capacitor. The other layers of the 3D capacitor structure are formed over texture at the top surface of the substrate 102. In FIG. 1A the texture takes the form of holes which extend from the top surface of the substrate 102 into the bulk of the substrate, but the textured surface may take other forms (e.g. trenches, columns, etc.). A continuous dielectric layer 104 lines the walls of the holes. The dielectric layer 104 constitutes the dielectric of the 3D capacitor. The top electrode of the 3D capacitor is formed by a conductive layer 106 which fills the holes and has a plate-shaped portion 107 at the top surface of the substrate. Thus, here the 3D capacitor has a MIS structure (metal-insulator-semiconductor). A top contact plate 109 is provided over the thin-film portion 107 of the top capacitor electrode and constitutes one terminal (top terminal) of the RC component 100. The top contact plate 109 and the thin-film portion 107 of the top capacitor electrode have the same size and shape and are bonded directly to one another.

A conductive layer 112 (backside metallization) is provided on the bottom surface of the substrate 102. The conductive layer 112 constitutes the second terminal (bottom terminal) of the RC component 100. This bottom terminal may be soldered or sintered to a conductive mounting surface. The resistivity of the bulk substrate material located between the MIS capacitor and the backside metallization 112 provides the resistance of the RC component. Accordingly, the substrate proposed in the von Dorp paper was a highly p-doped silicon substrate.

In the RC component 100 represented in FIGS. 1A-1C, the capacitor and resistor structures extend through the substrate in the direction of the substrate's thickness, and are arranged successively between the top and bottom surfaces of the component. An RC snubber having this configuration may be referred to as a "vertical" snubber. The terminals 109, 112 provided on the opposite sides of the RC component 100 (opposite sides in the thickness direction of the substrate) make it possible to connect the RC component 100 in parallel to other devices, as illustrated in FIG. 1C, using relatively low-inductivity connections.

FIG. 1C illustrates a case in which a vertical snubber 100 and a device to be snubbed 200 are both mounted on a direct bonded copper (DBC) substrate 400. RC snubbers are often used to suppress oscillations in active switching elements such as a fast vertical power transistor (GaN, SiC, LDMOS, . . . ). In the example illustrated in FIG. 1C, the device 200 is a vertical power transistor. The vertical RC snubber needs to be placed very close to this vertical power transistor so that the inductive parasitics ($L_{bond}$) due to the bonding wires is minimized (enabling fast switching without additional parasitic oscillation). Because the top surface of the DBC substrate is conductive, it interconnects the bottom terminal 112 of the RC component 100 with the drain of the power transistor 200. Bonding wires 310 electrically connect the top contact plate of the vertical RC snubber 100 to a source contact provided on the top surface of the power transistor 200. With an arrangement of this kind, the RC snubber can be mounted in the direct vicinity of the associated device 200. Bonding wires 320 electrically connect the top contact plate of the vertical RC snubber 100 to an external element, e.g. an output for the source of the power transistor, a power supply, etc. (not shown in FIG. 1C), via a conductor 500 on the PCB.

When an RC network constitutes an RC snubber the impedance of the snubber should match the characteristic impedance of the circuit being snubbed in order for optimal attenuation performance to be achieved. Accordingly, if a manufacturer wishes to produce monolithic RC components that can be used with a wide variety of active circuits then, to cater for different possible impedance values of the circuits to be snubbed, there is a need to be able to fabricate a range of devices having different values of resistance, typically covering the range from $0.1\Omega$ to $1.0\Omega$ (in $0.1\Omega$ increments) and the range from $1\Omega$ to $10\Omega$ (in $1\Omega$ increments). So, a manufacturer may wish to produce twenty components having different resistance values, with the lowest-rated device having resistance of $0.1\Omega$ and the highest-rated device having resistance of $10\Omega$. This represents a one-hundredfold increase in resistance from the lowest-resistance component to the highest-resistance component in the set.

In the case of the vertical RC component illustrated in FIGS. 1A-1C, in which the resistance value of the RC component depends primarily on properties of the bulk substrate material, this hundredfold variation in resistance can be obtained either by varying the thickness of the substrate or by varying the resistivity of the substrate. However, neither of these options is feasible, for the reasons explained below.

Varying the Thickness of the Component:

For mechanical reasons (related to the stress induced by the backside metallization and the overall mechanical robustness), vertical silicon components are rarely thinner than of the order of 50 μm. This is also true for the vertical power transistor 200. This would mean that, to realize a range of components having resistance values running from $0.1\Omega$ to $10\Omega$, the thickness of the RC component should be modulated by a factor 100 (e.g. from 50 μm to 5000 μm). If the lowest-rated component has a height to match that of the power transistor (as illustrated in the top image in FIG. 2) then, as the resistance rating increases, the length of the bonding wires 320 must increase and quickly becomes impractical (as can be appreciated from the bottom image in FIG. 2 wherein the thickness of the substrate has been increased a mere 8 times compared to the upper image). This excessive extension of the bonding wires is unacceptable because as the length of the bonding wires increases the parasitic inductance increases also.

Varying the Resistivity of the Wafer:

Assuming that it is desired to keep the thickness of the RC component substantially constant, say equal to the thickness of the vertical power transistor (around 50 μm), the remaining parameter available for use to modulate the resistance is the substrate resistivity. There are a number of problems with such an approach.

a—To cover the proposed range of resistance values would entail production of numerous substrates having different values of resistivity (e.g. 20 different values). Logistically, this is not practical in industrial production.

b—Considering a component which has a surface area of 10 square millimeters (3.3 mm×3.3 mm), and 30 μm thickness for the capacitor, this leaves approximately 20 μm thickness for the vertical resistor. This would entail the use of wafers having resistivity between approximately 5 Ω·cm and approximately 500 Ω·cm. High resistivity wafers at the top end of this range are not in general circulation and must be procured from specialist manufacturers. Furthermore, the nominal resistivity accuracy of such high resistivity wafers is about +/−50%. As a consequence, the control of the nominal resistance value of the RC component would be worse than 50%.

c—High resistivity (low doped) silicon substrates are known to have properties which are highly temperature dependent. In view of the likely temperature range of operation of RC components this would produce undesirably large variation of resistance over the operating range. For example, in the case of a Si substrate having a doping concentration of $10^{16}\cdot cm^{-3}$ the resistivity of the substrate varies by 60% over the temperature range 25-200° C.

d—It is known to be difficult to make good ohmic contact with standard backside metallization in the case of using a high resistivity silicon substrate.

The present invention has been made in the light of the problems discussed above.

SUMMARY OF THE INVENTION

The present invention provides an integrated RC architecture comprising a substrate, a capacitor having a thin-film top electrode portion at a surface on a first side of the substrate, an insulating layer provided on the thin-film electrode portion of the capacitor, a plate-shaped contact provided on the insulating layer, and a set of plural bridging contacts traversing the insulating layer and electrically connecting the thin-film top electrode portion of the capacitor to the plate-shaped contact, the bridging contacts being distributed across the surface area of the thin-film electrode portion of the capacitor.

In RC architectures according to embodiments of the invention, the nominal resistance value may be set to a desired value selected in a wide range, simply by choosing how many contacts to include in the set of bridging contacts. Thus, RC architectures can be manufactured which have different resistance values but which otherwise have similar physical properties, for instance: the same footprint, same thickness, and the same contact layout. This facilitates standardization in manufacturing, packaging, and integrating or mounting the architectures. For example, when such RC architectures are implemented as monolithic RC components, the components can be connected to bonding wires in layouts having the same axes.

Furthermore, it should be noted that RC architectures according to embodiments of the invention not only offer great flexibility in setting of the resistance value but also have high performance in terms of a combination of metrics.

RC architectures embodying the invention have a well-controlled resistance value of the resistor included in the RC network (<10% variation from the target value). Moreover, there is little variation in the resistance value as the temperature changes (of the order of a few 100 s of ppm/K). This is a significant consideration for RC architectures that are applied as snubber networks, because snubbers absorb energy during operation, heat up, and often need to withstand relatively large temperature ranges (for example from room temperature up to around 200° C.). embodiments of RC architecture according to the invention have low temperature drift, notably temperature drift which is at least an order of magnitude better than that reported, in the vom Dorp paper, for the device illustrated in FIGS. 1A-1C.

Embodiments of RC architecture according to the invention can withstand significant voltage levels (several tens or hundreds of volts) and current levels (several amps or tens of amps). When the RC architecture is used as a snubber network, there is a good response of the snubber network to signals which have fast rise times. Embodiments of RC architecture according to the invention may constitute integrated passive devices (IPDs) that can be associated with various power circuits and only a small surface area is required for mounting such IPDs on an electronics board.

In certain embodiments of the invention where the RC architectures constitute RC snubbers, the contact layout facilitates low inductivity connection of the snubber to the circuit being snubbed, thus avoiding decoupling of the snubber's resistor by parasitic inductance of the interconnection line.

In certain embodiments of the invention the locations of the bridging contacts are distributed evenly across the surface area of the thin-film electrode portion of the 3D capacitor. This simplifies the calculation of the relationship between the number of bridging contacts and the resistance of the RC component.

In certain embodiments of the invention, the capacitor is a 3D capacitor, the substrate is a low ohmic substrate and electrical contact to the bottom electrode of the capacitor is made through the low ohmic substrate. In the case where contact to the bottom electrode of the capacitor is made through the substrate, the substrate makes a reduced contribution to the overall resistance of the RC component in the case where it is a low ohmic substrate. This enables control of the resistance of the RC component to be exercised primarily by control of the properties of the bridging contacts.

In certain embodiments of the invention, the thin-film electrode portion of the capacitor is made of polysilicon.

The present invention further provides a method of fabricating an RC component, comprising forming a capacitor having a thin-film top electrode portion at a surface on a first side of a substrate; forming an insulating layer on the thin-film top electrode portion of the capacitor; forming a set of plural bridging contacts traversing the insulating layer; and forming a plate-shaped contact on the insulating layer. Moreover, according to the exemplary method, the set of bridging contacts electrically connect the thin-film top electrode portion of the capacitor to the plate-shaped contact, and the bridging contacts are distributed across the surface area of the thin-film top electrode portion of the capacitor.

This fabrication method makes it possible to set the nominal resistance value of the RC component to a desired value, selected in a wide range, simply by choosing how many contacts to include in the set of bridging contacts. Accordingly, the logistical challenge involved in manufacturing components having different resistance values is greatly reduced. For example, in a case where the bridging contacts are formed by using a photolithographic process to create via holes in the insulating layer and then filling the via holes with a conductive material, the resistance value can be changed simply by swapping the mask used in the photolithographic process.

The invention yet further provides a method of controlling the resistance of the above-described RC component, comprising acquiring a target value for the resistance of the RC component, and setting the number of bridging contacts dependent on the acquired target resistance value.

BRIEF DESCRIPTION OF THE DRAWINGS

Further features and advantages of the present invention will become apparent from the following description of certain embodiments thereof, given by way of illustration only, not limitation, with reference to the accompanying drawings in which:

FIGS. 1A-1C illustrate a known monolithic component incorporating an RC architecture, in which FIG. 1A represents a cross-section through the component, FIG. 1B represents an equivalent circuit to the FIG. 1A structure, and FIG. 1C illustrates an arrangement for connecting the RC component to another device, on a mounting substrate;

FIGS. 3A-3C illustrate an RC architecture according to an embodiment of the present invention, in which FIG. 3A represents a cross-section through the architecture, FIG. 3B represents an equivalent circuit to the FIG. 3A structure, and FIG. 3C illustrates an arrangement for connecting a monolithic component incorporating the RC architecture of FIG. 3A to another device, on a mounting substrate;

DETAILED DESCRIPTION OF EXEMPLARY EMBODIMENTS

Figure 2:
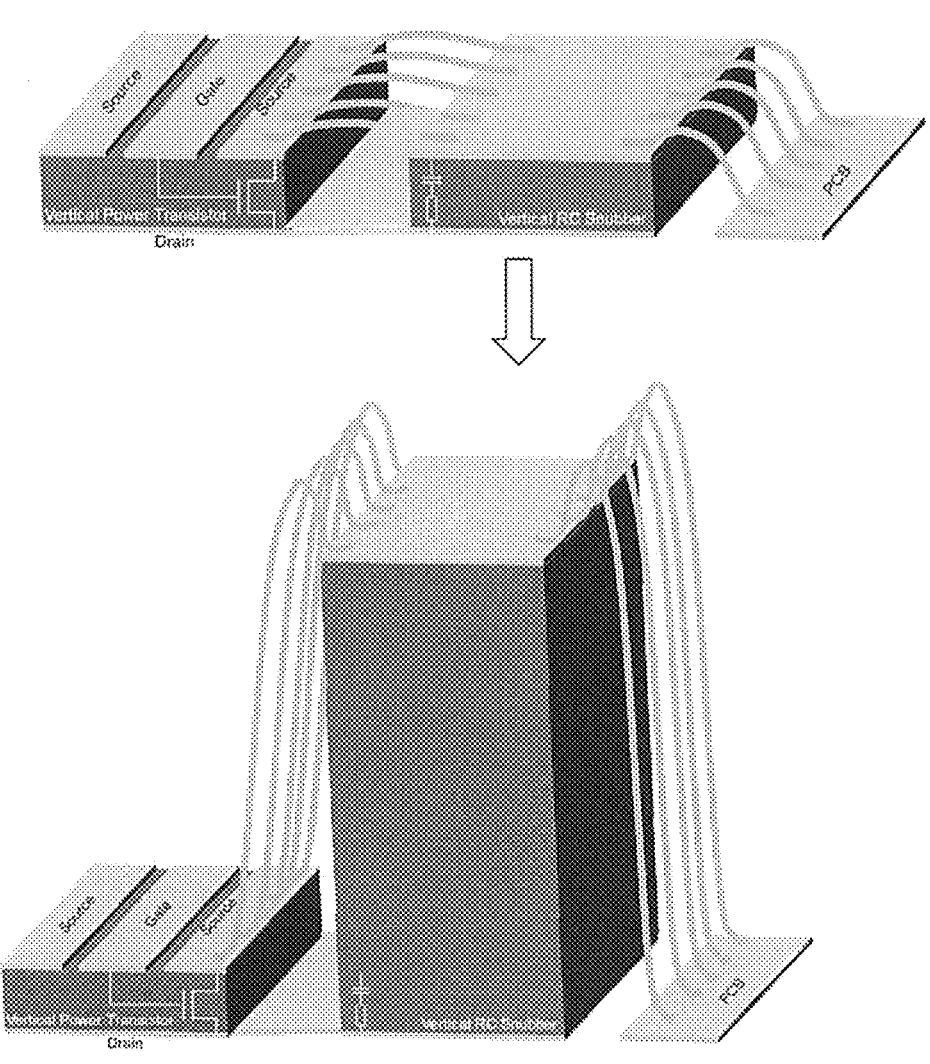
FIG. 2 is a diagram illustrating the effect of increasing the resistance of a device according to FIG. 1A by variation of the thickness of the substrate.

An RC architecture according to a first embodiment of the invention, and an example method for fabricating the architecture, will now be described with reference to FIGS. 3-5. In the illustrated example the RC architecture is implemented as a monolithic RC component (IPD). However, in other embodiments of the invention the RC architecture may be integrated with other devices/circuits.

As can be seen from FIG. 3A, the monolithic RC component 1 comprises a substrate 2. In the example illustrated by FIGS. 3 to 5, the substrate 2 is a low ohmic semiconductor substrate which defines the bottom electrode of a MIS structure constituting a three-dimensional (3D) capacitor. The 3D capacitor structure is formed over a set of holes which extend from the surface at a first side 2a of the substrate 2 into the bulk of the substrate. It will be understood that, in other embodiments, the 3D capacitor structure may make use of other texture provided in this surface of the substrate 2 (e.g. trenches, columns, . . . ).

A continuous dielectric layer 4 is formed on the set of holes and conformally follows the contours of the surface, lining the walls of the holes. The dielectric layer 4 constitutes the dielectric of the 3D capacitor. The top electrode of the 3D capacitor is formed by a conductive material 6 which fills the holes and extends in a layer 7 at the surface of the substrate. A contact plate 9 is provided parallel to the layer 7 of the top capacitor electrode, separated by an insulating layer 10. The contact plate 9 may be used as one terminal (top terminal) of the RC component 1. In the illustrated example, the contact plate 9 and the layer 7 of the top capacitor electrode have the same surface area and peripheral shape. If desired, the contact plate 9 and the layer 7 of the top capacitor can have different surface areas from one another and/or different peripheral shapes from one another.

A set of bridging contacts 8 are formed through the insulating layer and electrically interconnect the layer 7 of the 3D capacitor electrode and the contact plate 9. The locations of the bridging contacts 8 are distributed over the surface of the layer 7, as can be seen from FIG. 2C. Nine bridging contacts are represented in FIG. 2C. However, the number N of bridging contacts is set as a function of the target resistance of the RC component, as shall be explained below.

A conductive layer 12 (backside metallization) is provided on the bottom surface of the substrate 2. The conductive layer 12 constitutes a bottom contact of the RC component 1.

In the RC component 1 according to the embodiment of the invention represented in FIGS. 3A and 3B, the 3D capacitor structure extends through the substrate in the direction of the substrate's thickness, and opposing electrodes of the 3D capacitor are accessible at opposite sides 2a, 2b of the substrate 2. The resistance of the RC component depends on the contact structure at side 2a of the RC component, involving the contact plate 9 and the bridging contacts 8, but there may also be a resistance contribution from the bulk substrate 2. However, the contribution made by the substrate 2 may be reduced by employing a low ohmic substrate, in which case the equivalent circuit represented on the left-hand side of FIG. 3B tends towards the equivalent circuit illustrated at the right-hand side of FIG. 3B.

For example, in a case where the sheet resistance is 100 Ohms per square, typically the substrate is n$^{++}$ doped so that resistivity of the substrate is set from 1 mOhm·cm to 5 mOhm·cm. Thus, the substrate does not make a significant contribution to the overall resistance of the RC network. If the sheet resistance is increased (say, to 1 kOhm per square) then it is permissible to use a higher ohmic substrate, i.e. a substrate having a lower doping level. Preferably the doping of the substrate is set so that the substrate makes a contribution of no more than 5% (more preferably of the order of 1%) to the resistance of the RC network, while still ensuring that ohmic contact can be made with the backside metallization.

The RC component 1 may be assembled and connected to a vertical power transistor (or other circuit) on a mounting substrate such as a DBC substrate in a comparable manner to that illustrated in FIG. 1C for the prior art device.

As noted above, the choice of material for the semiconductor substrate 2 can affect the overall resistance of the RC architecture and this may reduce the controllability of the setting of the resistance value via the bridging contacts 8 and/or may deteriorate the temperature performance. Accordingly, to reduce the contribution which the substrate makes to the overall resistance, the substrate may be highly doped so as to be low ohmic. For example, N type silicon may be used having a doping level of the order of $10^{19}$ cm$^{-3}$.

Semiconductor materials other than silicon may also be used, e.g. GaAs, with appropriate doping levels so that the substrate is low ohmic.

The dielectric layer 4 may be made of a material (or stack of materials) such as $SiO_2$, SiN, $Al_2O_3$, $HfO_2$, etc.

The conductive material 6 used to form the top capacitor electrode and the layer 7 may be polysilicon. In this case, because the final resistor in the architecture is defined by the sheet resistance of the polysilicon layer, the drift of the resistance value with temperature is the same as for a standard polysilicon process, and can be as low as a few 100 ppm/° C. Furthermore, the absolute accuracy of the resistance is the same as for a standard polysilicon process, i.e. the variation in nominal value in a batch of products can be <10%.

It will be understood that conductive materials other than polysilicon may be used to form the top capacitor electrode, for example, TiN, Si/Ge, etc.

The sheet resistance of the polysilicon top capacitor electrode can be adjusted by appropriate control of the doping of the material forming the top capacitor electrode. The sheet resistance of the top capacitor electrode can be adjusted in the same way in the case where this electrode is made of other semiconductor materials.

The insulating layer 10 may be made of any convenient insulating material. An example material is $SiO_2$ which is selected in view of its ubiquity and the fact that it enables an insulating layer having only moderate stress to be produced, but the invention is not limited to the use of this material. Other materials may be used, including materials such as SiN (assuming that increased stress is acceptable), and less common materials such as BCB (benzocyclobutene).

The bridging contacts 8 may be made of any convenient conductive material. To avoid having a significant impact on the resistance of the finished component, it is advantageous for the bridging contacts to be made of a material having conductivity greater than that of the material forming the top capacitor electrode. In the case where the top capacitor electrode is made of polysilicon, an example material that may be used for the bridging contacts is aluminium (especially high purity aluminium having low granularity, which facilitates assembly), but the invention is not limited to use of this material.

The contact plate 9 may be made of may be made of any convenient conductive material. In practice, the nature and dimensions of the plate 9 may be selected taking into account constraints that derive from the process (wire-bonding, ribbon bonding, etc.) that is used to assemble the RC component 1 with other components.

In a case where the contact plate 9 is made of the same material as the bridging contacts 8, both elements may be formed in a common manufacturing process, which simplifies fabrication. Also, in a case where the contact plate 9 and bridging contacts 8 are made of the same material there is an improved mechanical and electrical connection between them. The latter property is advantageous because a poor-quality contact to the underlying polysilicon could in itself introduce a contribution to the overall resistance of the component. The layer 12 may be made of one or more conductive layers, such as metals. As one example, the layer 12 may be made of a stack of Ti, Ni and Au (or Al) layers, with the Ti layer improving adhesion to the semiconductor substrate, Ni serving as a barrier layer and Au (or Al) providing good solderability of the component.

Figure 4A:
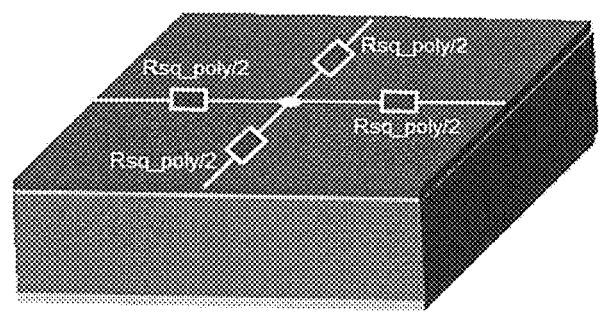
FIGS. 4A-4C illustrate how the equivalent series resistance at the top contact of the RC architecture of FIG. 3A component can be modulated by varying the number of bridging contacts between a thin-film top electrode portion of the capacitor and a contact plate.
Figure 4B:
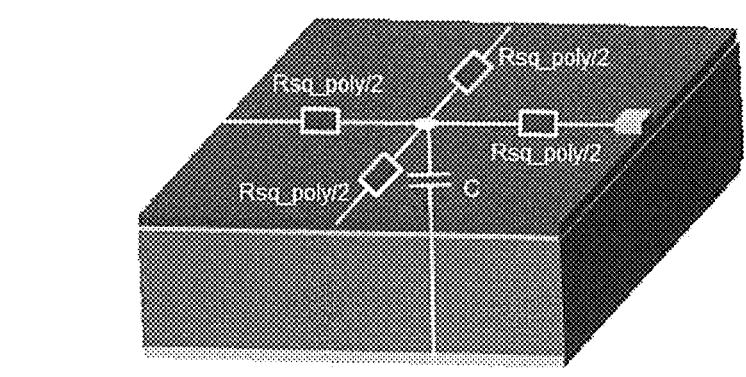
Figure 4C:
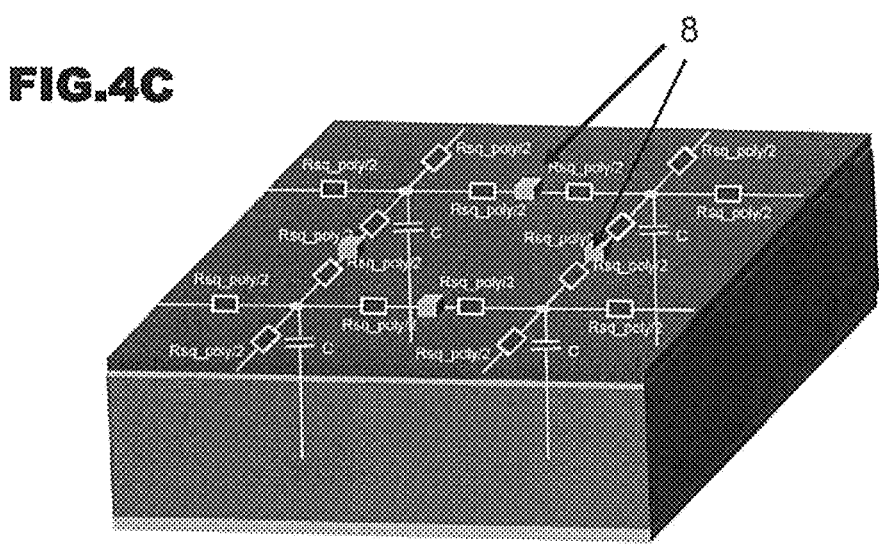

FIG. 4 shows a set of diagrams (FIGS. 4A-4C) to assist an explanation of how the use of the contact structure involving the contact plate 9 and the set of bridging contacts 8 enables the resistance of the RC architecture to be set. In FIGS. 4A-4C it is assumed that the capacitor-electrode portion 7 has a square peripheral shape.

When the electrical properties of a thin film or plate of material are discussed it is common to refer to the sheet resistance of the film/plate. As is well known, the sheet resistance of a material is a quantity that is quoted in Ohms per square, and the electrical resistance of a sheet of a specific material is calculated according to the following relation:

$$R = R_s \frac{L}{W}$$

where R is the electrical resistance provided by the sheet, Rs is the sheet resistance of the material forming the sheet, L is the length of the sheet and W is the width of the sheet. Thus, it can be understood that, provided that different sheets of a specific material are all square (i.e. L/W=1), these sheets will all have the same electrical resistance, irrespective of whether the sheets are of the same size. The present invention exploits this property.

FIG. 4A illustrates a simplified electrical model of the capacitor electrode portion 7 (made of resistive polysilicon), in which Rsq_poly represents the sheet resistance of this polysilicon thin film 7. Rsq_poly is a function of the resistivity of the material, and of its thickness.

FIG. 4B then represents a very simplified electrical model of the case where the capacitor and a single metal contact are added to FIG. 4A. It can be understood that the resistive access to the capacitor (or equivalent series resistance, ESR) is a function of the sheet resistance of the polysilicon layer 7, i.e. ESR=f (Rsq_poly).

However, if the number of contacts is increased to a number N, as illustrated by the simplified electrical model of FIG. 4C, the polysilicon thin film 7 is notionally sub-divided into N smaller polysilicon squares sheets each having the same resistance value. If the N contacts are then connected together by a very low resistive plate (metal plate), i.e. the contact plate 9, the N smaller polysilicon squares will be virtually connected in parallel. Accordingly, the ESR becomes a function of the sheet resistance of layer 7 divided by the number N of bridging contacts 8, i.e. ESR=f (Rsq_poly/N).

Thus, the resistance of an RC architecture embodying the invention can be adjusted by varying the number N of bridging contacts interconnecting the contact plate 9 to the capacitor-electrode layer 7. This can be easily realized with 1 additional isolation layer (e.g. SiO₂) between these two layers.

The above analysis is applicable in cases where the top plate-shaped electrode 7 of the capacitor is a thin film, that is, the thickness of the top plate-shaped electrode 7 is much less that the length of the bridging contacts. Typically, in the present embodiment of the invention a thin film plate-shaped capacitor top electrode made of polysilicon is less than 1 micrometer thick.

RC architectures embodying the present invention provide a number of advantages, such as:

Ability to withstand high currents: the inrush current is vertically divided by the N contacts and then spreads horizontally in all directions in the portion of the capacitor-electrode layer 7 connected to each contact. Furthermore, there is a quasi-vertical current path in the thin capacitor-electrode layer 7.

Small footprint: the surface area occupied by the architecture is small irrespective of the resistor value.

Low thickness: the thickness of the architecture does not need to vary with the resistor value, and it can be as low as that of a power transistor (e.g. 50 μm).

No need for multiple substrate resistivities: the variety of resistance values can be achieved using just one value for wafer resistivity (preferably, highly doped).

Low process overhead for resistor variability: the resistance value may be programmed simply by 1 mask modification (contact opening).

Versatile wiring arrangements: wiring is possible on the 4 sides of the architecture.

Low temperature drift of the resistance.

Good absolute resistor accuracy.

Standard processes can be used for backside metallization (in the case of using a highly-doped silicon substrate).

The resistance value could also be changed by changing the dimensions (cross-sectional area, length) of the bridging contacts. However, typically the dimensions of the bridging contacts are set based on the desired current-handling capacity of the device, and then the resistance value is set by selecting an appropriate number of bridging contacts. Likewise, the resistance value could be changed by changing the dimensions of the contact plate 9. However, in general, the dimensions of the contact plate 9 are set in view of constraints relating to assembly.

In principle the locations of the bridging contacts 8 could be distributed over the surface area of the thin-film top electrode 7 of the capacitor in an uneven manner. This would have only a small impact on the resistance value observed at low frequencies. However, at higher frequencies such an uneven distribution of the bridging contacts 8 could lead to unpredictable variation in the value of resistance. In contrast, consistent frequency behaviour is observed in the case where the bridging contacts 8 are provided at locations that are evenly distributed over the surface area of the thin-film top electrode of the capacitor. Thus, for example, the area of the top electrode may be notionally divided up into squares and bridging contacts 8 may be positioned, respectively, at the centers of the squares. However, other even distributions may be used, for example, the bridging contacts may be positioned on concentric circles, evenly spaced from each other.

An example implementation of a method for fabricating an RC component 10 such as that of FIG. 3A will now be described with reference to the flow chart of FIG. 5 and the diagrams shown in FIG. 6.

Figure 5:
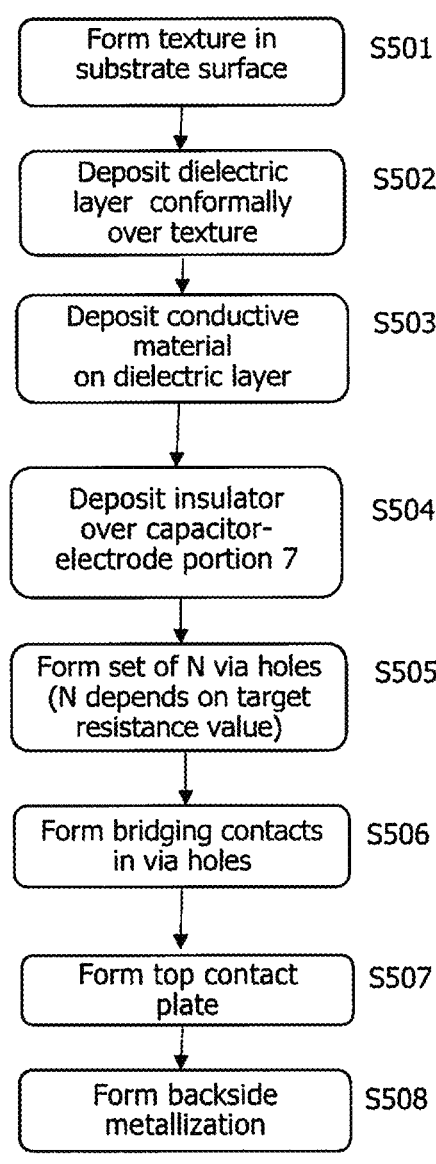
FIG. 5 is a flow diagram illustrating steps in an embodiment of a method of fabricating the RC architecture of FIG. 3.
Figure 6:
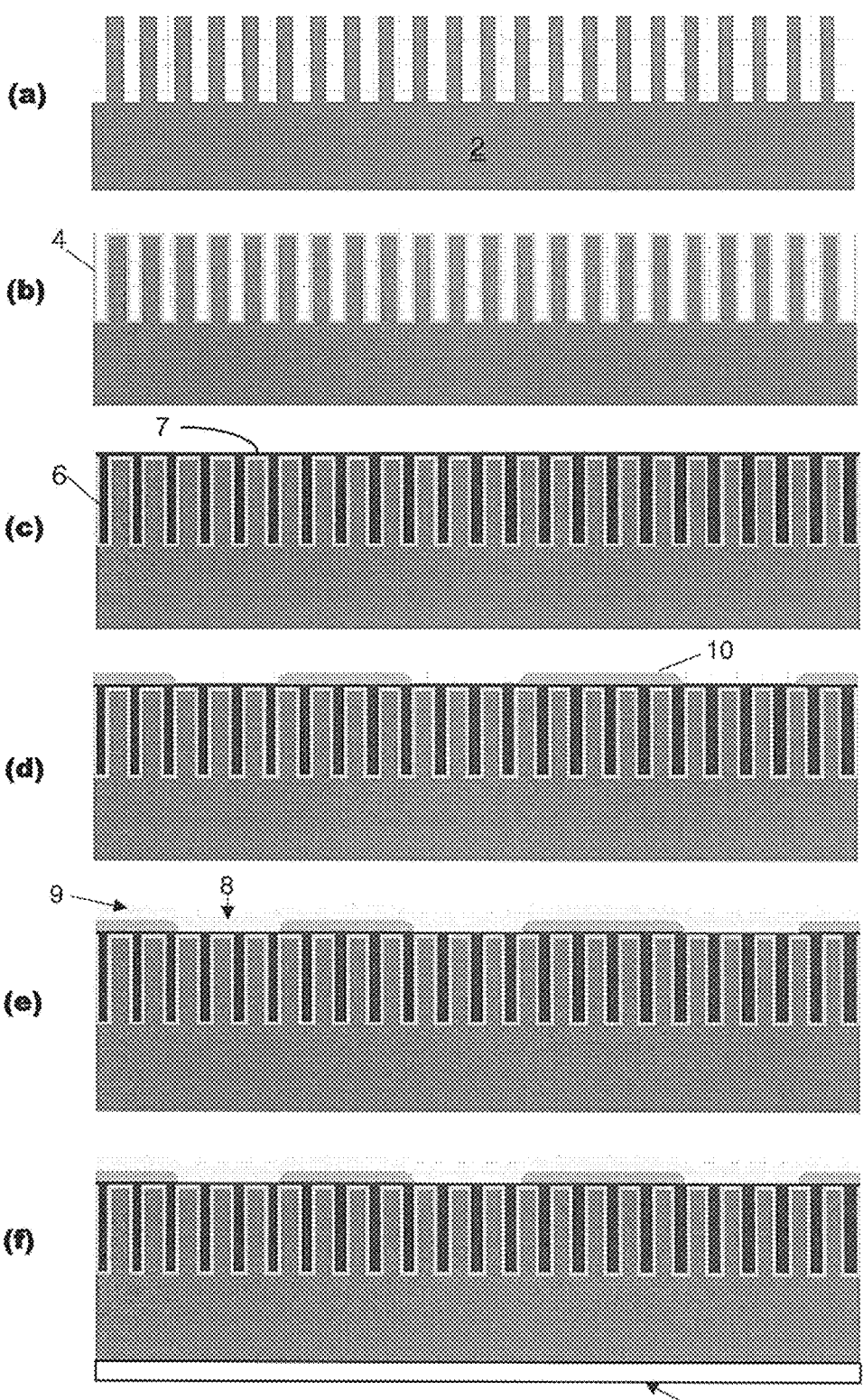
FIG. 6 shows a series of views illustrating the steps of FIG. 5.

It is assumed that a suitably-prepared semiconductor substrate is provided at the start of the method illustrated by FIG. 5. This may be, for example, a low-ohmic (highly-doped) silicon wafer in which multiple RC architectures according to the invention will be fabricated simultaneously. For simplicity, the following description only discusses formation of a single RC architecture intended to be a standalone component. Conventional processes may be used to form the elements of the MIS capacitor structure.

Texture (e.g. holes, trenches or columns) is created in a surface of the substrate 2 (step S501). The texture may be created, for example, using masking and etching processes. Diagram (a) of FIG. 6 represents the substrate after texture has been created in a surface thereof. Then the dielectric layer 4 is deposited so as to conformally coat the textured surface (step S502), for example by chemical vapour deposition, atomic layer deposition, etc. Diagram (b) of FIG. 6 represents the substrate after deposition of the dielectric layer 4.

Next, the conductive material 6 is deposited over the dielectric layer 4 (step S503), for example by chemical vapour deposition process. The conductive material 6 may be deposited to conformally cover the dielectric layer and to extend in a layer (e.g. a thin film) 7 at the surface of the substrate. For example, the conductive material 6 may fill the holes that are lined by the dielectric layer and create a film or plate-shaped layer 7 at the surface of the substrate. Diagram (c) of FIG. 6 represents the substrate after deposition of the conductive material 6.

An insulating layer 10 is then formed on the capacitor-electrode portion 7 (S504), for example by depositing a layer of SiO$_2$ by a plasma enhanced chemical vapor deposition process, or any other convenient process. A patterning process may then be used (step S505) to create a set of N via holes in the insulating layer. Diagram (d) of FIG. 6 represents the structure after the insulating layer 10 has been formed and the via holes created. As explained above, the number N of via holes may be set dependent on the target resistance of the RC component. The patterning process may be performed in any convenient manner and may include the steps of depositing a photoresist layer on the insulating layer (e.g. by spin coating), exposing and developing the photoresist to form a mask defining locations where via holes are to be formed, etching the insulating layer through the mask and removing the remaining photoresist.

Next, a number N of bridging contacts are formed in the via holes (S506), notably by filling the via holes with a conductive material. The conductive material may be deposited by any convenient process, e.g. sputtering, CVD, PVD, etc. A contact plate 9 is then formed on the insulating layer (S507), for example by PVD. The contact plate 9 is electrically connected to the capacitor-electrode portion 7 by the bridging contacts. Diagram (e) of FIG. 6 represents the structure after the bridging contacts and contact plate have been formed. Finally, the backside metallization 12 is formed on the surface of the substrate opposite to the surface upon which the contact plate 9 is formed (S508). Conventional processes may be used to create the backside metallization. Diagram (f) of FIG. 6 represents the structure after the backside metallization has been formed.

Although FIG. 5 shows the formation of the bridging contacts 8 and the formation of the contact plate 9 as separate processes, it should be noted that these elements may all be formed in a common process.

The above description relates to the case where the capacitor in the RC network is a 3D capacitor and a low ohmic substrate constitutes the bottom electrode of the capacitor. However, the invention is not limited having regard to the technology used to implement the capacitor.

Figure 7:
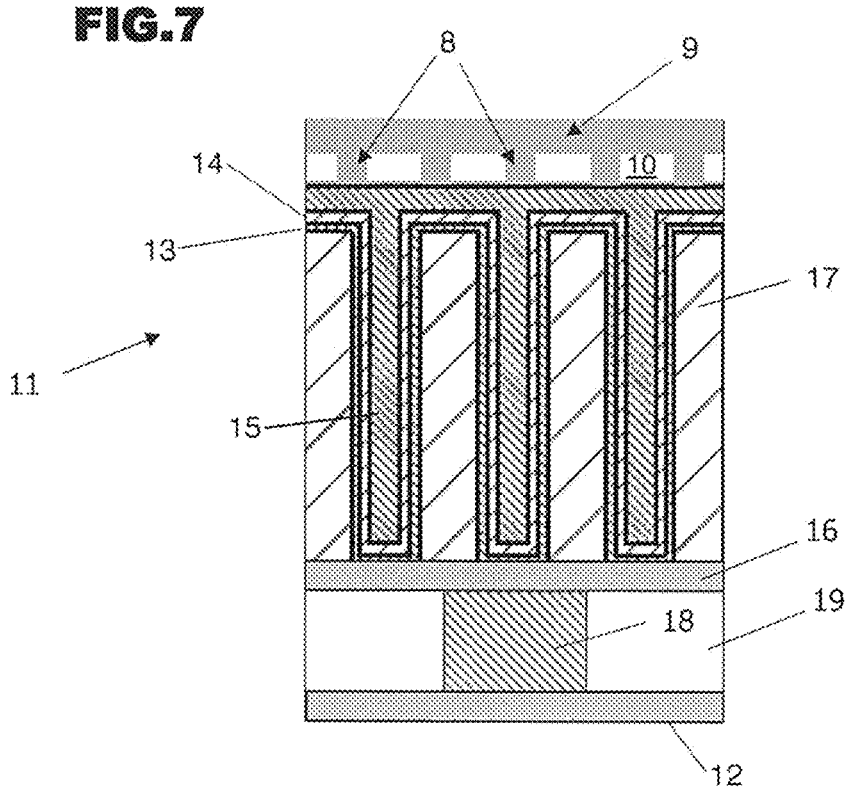
FIG. 7 is diagram illustrating an architecture according to another embodiment of the invention employing a 3D capacitor.

Thus, for example, in another embodiment of the invention, illustrated in FIG. 7, a 3D capacitor is made by depositing layers of a MIM (metal-insulator-metal) stack in the pores of a porous anodic oxide region 17 provided in a metal layer (not shown). The lower metal layer of the MIM stack is designated 13 in FIG. 7, the insulator layer is designated 14 and the top metal layer is designated 15.

As an example, the metal layer may be an aluminium layer and the anodic oxide may be aluminium oxide made by anodization of a selected region in the aluminium layer. The pores of the anodic oxide region 17 may extend all the way through the metal layer so that the inside of each pore communicates with an underlying conductive layer 16. In certain implementations of the embodiment of FIG. 7, the conductive layer 16 and the overlying metal layer are formed on a substrate 19, before the anodization process is performed. To enable the bottom terminal of the RC architecture 11 to be provided at the bottom of the structure, a conductive layer 12, serving as the bottom contact, may be provided and electrical contact between the bottom electrode of the 3D capacitor is achieved via a conductor 18 passing through the substrate 19. If desired, lateral isolation bands (not shown), made of electrically-insulating material, may be provided through the conductive layer 16, and this facilitates the integration of additional components in the device, either to the left and/or right sides of the 3D capacitor illustrated in FIG. 7, or in additional layers above or below the illustrated structure.

Further information regarding how to fabricate a 3D capacitor in the pores of a porous anodic oxide region, and regarding techniques for integration of additional components, may be found in EP 3 063 789.

Although FIG. 7 illustrates a 3D capacitor incorporating a MIM stack it should be understood that additional insulator and conductor layers may be provided (i.e. the stack may be a MIMIM stack, MIMIMIM stack, etc.).

Figure 8:
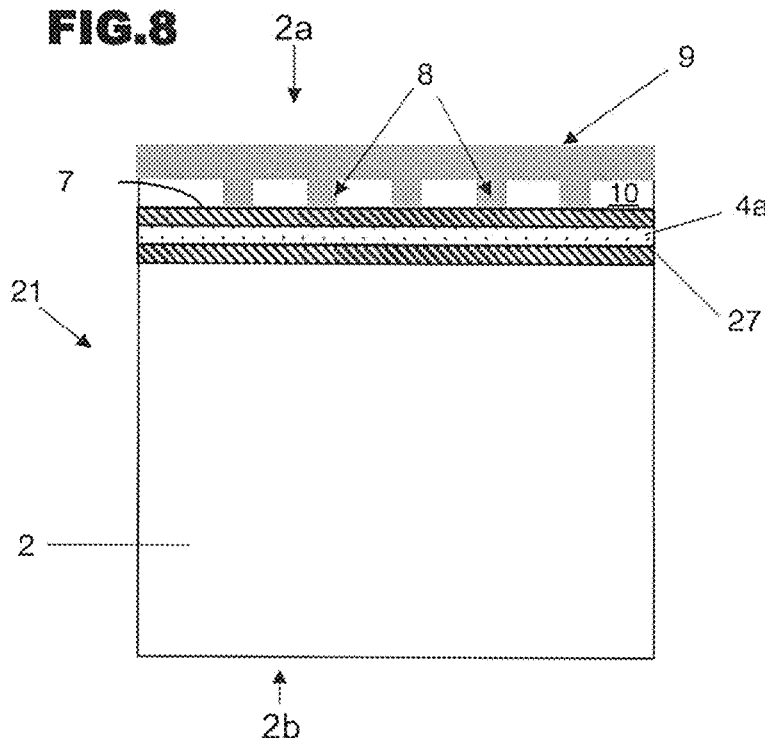
FIG. 8 is diagram illustrating an architecture according to an embodiment of the invention employing a planar capacitor.

As another example of variation in the design of the capacitor, FIG. 8 illustrates an embodiment of RC architecture 21 implementing the invention in which the capacitor is a planar capacitor having a bottom electrode 27 formed on the substrate 2, a dielectric layer 4a and a top electrode layer 10.

The embodiments illustrated in FIGS. 7 and 8 make use of distributed bridging contacts 8 and a contact plate 9 so as to set the resistance of the overall RC network to a desired value, as in the embodiment of FIGS. 3-5.

Finally, it is noted that although the present invention has been described above with reference to certain specific embodiments, it will be understood that the invention is not limited by the particularities of the specific embodiments. Numerous variations, modifications and developments may be made in the above-described embodiments as would be appreciated to one skilled in the art.

It is to be understood that references in this text to directions and locations, such as "top" and "bottom", merely refer to the directions that apply when architectures and components are oriented as illustrated in the accompanying drawings. Thus a surface which may be "top" in FIG. 2A would be closest to the ground if the component 1 were to be turned upside down from the illustrated orientation.

The invention claimed is:

1. An integrated RC component comprising:
    a substrate including a first surface on a first side and a second surface on a second side, the second side of the substrate opposite to the first side, the second side located below first side, wherein the first surface and the second surface are on separate flat planes, wherein the second surface is uniformly flat;
    a capacitor having a thin-film top electrode portion at the first surface on the first side of the substrate;
    an insulating layer arranged above the thin-film top electrode portion of the capacitor;
    a contact plate provided above and around the insulating layer;
    a set of plural bridging contacts traversing the insulating layer and electrically connecting the thin-film top electrode portion of the capacitor to the contact plate, the bridging contacts being evenly distributed across a surface of the thin-film top electrode portion of the capacitor in a grid formation; and
    first and second contacts arranged, respectively, on the first side of the substrate and on the second side of the substrate opposite to said first side, wherein the second contact is located below the second side and on the second surface of the substrate, wherein the first contact comprises the contact plate, and a series RC circuit is formed between the first and second contacts.

2. The RC component according to claim 1, wherein the substrate is a low ohmic semiconductor substrate doped to contribute no more than 5% to resistance of the RC component.

3. The RC component according to claim 1, wherein the bridging contacts are distributed evenly across the surface of the thin-film top electrode portion of the capacitor.

4. The RC component according to claim 2, wherein the capacitor is a 3D capacitor, the substrate is a low ohmic semiconductor substrate and a bottom electrode of the 3D capacitor is formed by the low ohmic semiconductor substrate.

5. The RC component according to claim 1, wherein the bridging contacts comprise a material having a conductivity greater than that of a material forming the top capacitor electrode.

6. The RC component according to claim 5, wherein the bridging contacts and the contact plate are integrally formed of a same material.

7. The RC component according to claim 1, wherein the capacitor is a 3D capacitor comprising a stack of MIM (metal-insulator-metal) layers formed in pores of a porous anodic oxide region in the substrate.

8. The RC component according to claim 1, wherein the thin-film top electrode portion of the capacitor comprises polysilicon.

9. The RC component according to claim 1, wherein, in a thickness direction of the thin-film top electrode portion of the capacitor, a length of the bridging contacts is greater than a thickness of the thin-film top electrode portion.

10. The RC component according to claim 1, wherein the top electrode portion of the capacitor has a square peripheral shape.

11. The RC component according to claim 1, wherein the contact plate and the top electrode portion of the capacitor have at least one of a same peripheral shape and a same size.

12. The RC component according to claim 1, wherein only a part of the capacitor top electrode to be located at the first surface on the first side of the substrate is a single planar sheet forming said thin-film top electrode portion.

13. A method of controlling a resistance of the RC component according to claim 1, the method comprising:

acquiring a target value for the resistance of the RC component, and setting a number of bridging contacts dependent on the acquired target resistance value.

14. The method of claim 13, further comprising:

acquiring a target current-handling capacity of the RC component;

setting a cross-sectional area and a length of the bridging contacts based on the target current-handling capacity; and setting the number of bridging contacts based on the set cross-sectional area and length of the bridging contacts as well as on the acquired target resistance value.

\* \* \* \* \*